US010823796B2

(12) United States Patent
Akita et al.

(10) Patent No.: US 10,823,796 B2
(45) Date of Patent: Nov. 3, 2020

(54) MAGNETIC RESONANCE IMAGING APPARATUS AND PULSE SETTING METHOD

(71) Applicant: Canon Medical Systems Corporation, Otawara-shi (JP)

(72) Inventors: Koji Akita, Yokohama (JP); Daisuke Uchida, Kawasaki (JP)

(73) Assignee: Canon Medical Systems Corporation, Otawara-shi (JP)

(*) Notice: Subject to any disclaimer, the term of this patent is extended or adjusted under 35 U.S.C. 154(b) by 38 days.

(21) Appl. No.: 16/174,479

(22) Filed: Oct. 30, 2018

(65) Prior Publication Data
US 2019/0128979 A1 May 2, 2019

(30) Foreign Application Priority Data
Oct. 31, 2017 (JP) .................................. 2017-210414

(51) Int. Cl.
| | | |
|---|---|---|
| *G01R 33/44* | (2006.01) | |
| *G01R 33/54* | (2006.01) | |
| *G01R 33/565* | (2006.01) | |
| G01R 33/24 | (2006.01) | |
| G01R 33/483 | (2006.01) | |

(52) U.S. Cl.
CPC ......... *G01R 33/443* (2013.01); *G01R 33/546* (2013.01); *G01R 33/5659* (2013.01); *G01R 33/246* (2013.01); *G01R 33/4833* (2013.01)

(58) Field of Classification Search
None
See application file for complete search history.

(56) References Cited

U.S. PATENT DOCUMENTS

| | | | |
|---|---|---|---|
| 7,701,211 B2 | 4/2010 | Katscher et al. | |
| 8,077,955 B2* | 12/2011 | Dannels ............... | G01R 33/246 324/309 |
| 2002/0161766 A1 | 10/2002 | Lawson et al. | |
| 2010/0239151 A1* | 9/2010 | Dannels ............... | G01R 33/243 382/131 |
| 2013/0082708 A1* | 4/2013 | Yokosawa ............ | A61B 5/055 324/309 |
| 2013/0229176 A1* | 9/2013 | Fautz .................. | G01R 33/246 324/307 |
| 2015/0015258 A1* | 1/2015 | Fautz .................. | G01R 33/246 324/309 |

(Continued)

FOREIGN PATENT DOCUMENTS

JP 2010221026 A * 10/2010 ........... G06T 11/003

*Primary Examiner* — Jermele M Hollington
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry acquires a $B_1$ sensitivity map of an imaging region that includes a subject. The processing circuitry sets a reference value in the $B_1$ sensitivity map. The processing circuitry estimates an error generated when calculating a $B_1$ map setting value based on the $B_1$ sensitivity map, by using the reference value and the $B_1$ sensitivity map. The processing circuitry calculates an amplitude and a phase of an RF pulse based on the error.

12 Claims, 6 Drawing Sheets

(56) References Cited

U.S. PATENT DOCUMENTS

| | | | |
|---|---|---|---|
| 2015/0077107 A1* | 3/2015 | Sharp | G01R 33/4625 |
| | | | 324/309 |
| 2016/0018500 A1* | 1/2016 | Morita | A61B 5/055 |
| | | | 324/309 |
| 2016/0187438 A1* | 6/2016 | Gui | G01R 33/5659 |
| | | | 324/309 |

* cited by examiner

MAGNETIC RESONANCE IMAGING APPARATUS AND PULSE SETTING METHOD

CROSS-REFERENCE TO RELATED APPLICATIONS

This application is based upon and claims the benefit of priority from the prior Japanese Patent Application No. 2017-210414, filed Oct. 31, 2017, the entire contents of which are incorporated herein by reference.

FIELD

Embodiments described herein relate generally to a magnetic resonance imaging apparatus and a pulse setting method.

BACKGROUND

In magnetic resonance imaging apparatuses, it is important to realize magnetization distribution homogeneity to obtain MR images without an imbalance in sensitivity. However, there is a case where an imbalance occurs in a spatial distribution of the high frequency magnetic field, i.e., a sensitivity map (hereinafter referred to as a "$B_1$ sensitivity map") of an RF (Radio Frequency) coil due to influence of a measurement target and a coil, which causes magnetic field inhomogeneity.

In order to mitigate inhomogeneity of the magnetic field, the amplitudes and the phases of the RF phases are properly controlled, and a strength distribution (hereinafter referred to as a "$B_1$ map setting value") is applied onto the $B_1$ sensitivity map. If the RF pulses are properly controlled so that the $B_1$ map setting value exhibits the inverse characteristics of the $B_1$ sensitivity map, the magnetization distribution obtained by the products of $B_1$ map setting value and the $B_1$ sensitivity map becomes homogeneous.

The $B_1$ map setting value is calculated, for example, by a method based on a linear approximation such as an STA (Small Tip Angle) approximation and a method based on a non-linear approximation such as an LTA (large Tip Angle) approximation.

In general, the STA approximation requires less calculation, but causes the greater degree of approximation error; whereas the LTA approximation requires greater calculation, but causes the less degree of approximation error. When setting RF pulse application by using the STA approximation, an optimal design method is needed for respective subjects to be imaged, considering that the inhomogeneity of the high frequency magnetic field $B_1$ varies depending on a subject or a part of a subject to be measured.

DETAILED DESCRIPTION

In general, according to one embodiment, a magnetic resonance imaging apparatus includes processing circuitry. The processing circuitry acquires a $B_1$ sensitivity map of an imaging region that includes a subject. The processing circuitry sets a reference value in the $B_1$ sensitivity map. The processing circuitry estimates an error generated when calculating a $B_1$ map setting value based on the $B_1$ sensitivity map, by using the reference value and the $B_1$ sensitivity map. The processing circuitry calculates an amplitude and a phase of an RF pulse based on the error.

Figure 1:
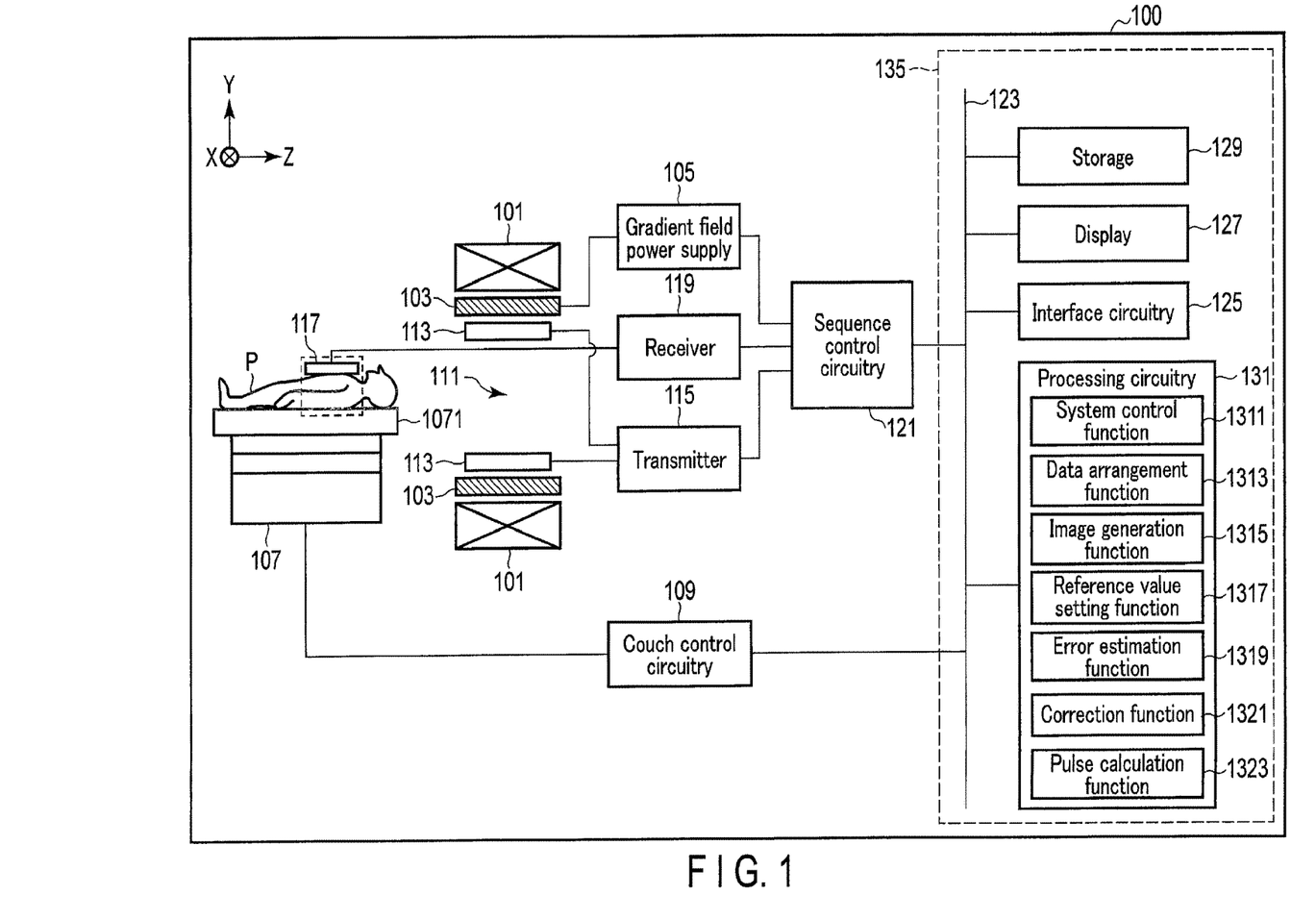
FIG. 1 is a block diagram of the configuration of a magnetic resonance imaging apparatus according to the present embodiment.

The configuration of a magnetic resonance imaging (MRI) apparatus according to the present embodiment will be described with reference to FIG. 1. FIG. 1 is a diagram showing the configuration of an MRI apparatus 100 according to the present embodiment.

As shown in FIG. 1, the MRI apparatus 100 according to the present embodiment includes a static field magnet 101, a gradient coil 103, a gradient field power supply 105, a couch 107, couch control circuitry 109, a transmitter coil 113, a transmitter 115, a receiver coil 117, a receiver 119, sequence control circuitry 121, a bus 123, an interface 125, a display 127, a storage 129, and processing circuitry 131. The MRI apparatus 100 may have a hollow cylindrical-shaped shim coil provided between the static field magnet 101 and the gradient coil 103.

The static field magnet 101 is a magnet formed in a hollow cylindrical shape, and generates a uniform static magnetic field ($B_0$) inside the hollow part. For example, a superconductive magnet, etc. may be used for the static field magnet 101. The non-illustrated shim coil may be formed in a hollow cylindrical shape inside the static field magnet 101. The shim coil is connected to a non-illustrated shim coil power supply, and the power supplied from the shim coil power supply allows the static magnetic field generated by the static field magnet 101 to be homogeneous.

The gradient coil 103 is a hollow cylindrical-shaped coil, and is disposed inside the static field magnet 101. The gradient coil 103 is formed by combining three coils respectively corresponding to the X-, Y-, and Z-axes which are orthogonal to each other. The Z-axis direction is defined as being the same as the direction of the static magnetic field. In addition, the Y-axis direction is a vertical direction, and the X-axis direction is a direction perpendicular to each of the Z-axis and the Y-axis. These three coils in the gradient coil 103 are separately supplied with a current from the gradient field power supply 105, and respectively generate gradient fields in which a magnetic field intensity changes along each of the X-, Y-, and Z-axes.

The gradient fields along each of the X-, Y-, and Z-axes generated by the gradient coil 103 respectively correspond to, for example, a frequency encode gradient field (readout gradient field), a phase encode gradient field, and a slice selective gradient field. The frequency encode gradient field is used to change a frequency of an MR signal in accordance with a spatial position. The phase encode gradient field is used to change the phase of magnetic resonance (MR)

signals in accordance with a spatial position. The slice selective gradient field is used to discretionarily determine an imaging slice.

The gradient field power supply 105 is a power supply apparatus that supplies a current to the gradient coil 103 by the control of the sequence control circuitry 121.

The couch 107 is an apparatus having the couch top 1071 on which a subject P is placed. The couch 107 inserts the couch top 1071, on which the subject P is placed, into the bore 111 under the control of the couch control circuitry 109. Normally, the couch 107 is installed in an examination room, where the MRI apparatus 100 is installed, in such a manner that the longitudinal axis of the couch 107 is parallel to the central axis of the static field magnet 101.

The couch control circuitry 109 is circuitry for controlling the couch 107, and is implemented by a processor, for example. The couch control circuitry 109 drives the couch 107 in response to an operator's instruction via the interface 125 to move the couch top 1071 in a longitudinal direction or a vertical direction.

The transmitter coil 113 is an RF (radio frequency) coil disposed inside the gradient coil 103. The transmitter coil 113 receives a high frequency pulse (RF pulse) from the transmitter 115, and generates transmission RF waves which correspond to a high frequency magnetic field. The transmitter coil is, for example, a whole body (WE) coil. The WB coil may be used as a transmitter/receiver coil.

The transmitter 115 supplies a high-frequency pulse modulated by a Larmor frequency to the transmitter coil 113 by the control of the sequence control circuitry 121. Specifically, the transmitter 115 includes an oscillator, a phase selector, a frequency converter, an amplitude modulator, a high-frequency power amplifier, etc. The oscillator generates a high-frequency signal of a resonance frequency specific to a target nucleus in the static magnetic field. The phase selector selects a phase of the high-frequency signal. The frequency converter converts a frequency of the high-frequency signal output from the phase selector. The amplitude modulator modulates an amplitude of the high-frequency signal output from the frequency converter, in accordance with a sins function, for example. The high-frequency power amplifier amplifies the high-frequency signal output from the amplitude modulator. As a result of the operation of each element, the transmitter 115 outputs to the transmitter coil 113 a high frequency pulse corresponding to the Larmor frequency.

The receiver coil 117 is an RF coil disposed inside of the gradient coil 103, and receives an MR signal emitted from a subject P by the high-frequency magnetic field. The receiver coil 117 outputs the received MR signal to the receiver 119. The receiver coil 117 is, for example, a coil array having one or more coil elements, typically having a plurality of coil elements. In FIG. 1, the transmitter coil 113 and the receiver coil 117 are illustrated as separate RF coils; however, the transmitter coil 113 and the receiver coil 117 may be implemented as an integrated transmitter/receiver coil. The transmitter/receiver coil is, for example, a local transmitter/receiver RF coil, such as a head coil, to serve an imaging target in the subject P.

The receiver 119 generates magnetic resonance data (MR data), which is digitized complex data based on the MR signals output from the receiver coil 117 by the control of the sequence control circuitry 121. Specifically, the receiver 119 performs various types of signal processing such as pre-amplification, intermediate frequency conversion, phase detection, low-frequency amplification, filtering, etc. to the MR signals output from the receiver coil 117, and then performs analog-to-digital (A/D) conversion to the signals subjected to the signal processing. The receiver 119 executes sampling to the A/D converted data. Via this processing, the receiver 119 generates MR data. The receiver 119 outputs the generated MR data to the sequence control circuitry 121. The MR data generated by the receiver 119 may be also referred to as raw data.

The sequence control circuitry 121 controls the gradient field power supply 105, the transmitter 115, and the receiver 119, in accordance with pulse sequence information output from the processing circuitry 131, and performs imaging on the subject P. The pulse sequence information includes a magnitude or a temporal width of a current supplied from the gradient field power supply 105 to the gradient coil 103, timing of supplying a current from the gradient field power supply 105 to the gradient coil 103, a magnitude of an RF pulse supplied from the transmitter 115 to the transmitter coil 113, timing of supplying an RF pulse from the transmitter 115 to the transmitter coil 113, timing of receiving an MR signal from the receiver 119, etc. The magnitude of the current supplied from the gradient field power supply 105 to the gradient coil 103 corresponds to a waveform of the gradient field in accordance with the pulse sequence.

The bus 123 is a transmission path through which data is transmitted between the interface 125, the display 127, the storage 129, and the processing circuitry 131. The bus 123 may be connected to various biosignal measuring instruments, external storage devices, etc. via a network, etc.

The interface 125 has circuitry for receiving various types of instructions and information that are input from an operator. The circuitry of the interface 125 is circuitry for a pointing device, such as a mouse, or for an input device, such as a keyboard, etc. The circuitry of the interface 125 is not limited to circuitry for physical operation members such as a mouse, a keyboard, etc. For example, the interface 125 may include electric signal processing circuitry that receives an electric signal corresponding to an input operation through an external input device provided separately from the MRI apparatus 100 and outputs the received electric signal to various circuitry.

The display 127 displays various types of information, such as an MR image, etc. reconstructed by an image generation function 1315, under the control of a system control function 1311 in the processing circuitry 131. The display 127 is, for example, a CRT display, a liquid crystal display, an organic EL display, an LED display, a plasma display, any other display known in this technical field, or a monitor, etc.

The storage 129 stores MR data arranged in k-space by a data arrangement function 1313, and image data generated by the image generation function 1315, etc. The storage 129 stores various types of imaging protocols, and imaging conditions including imaging parameters that define the imaging protocols, etc. The storage 129 stores programs corresponding to the various types of functions executed by the processing circuitry 131. The storage 129 is, for example, a RAM (Random Access Memory), a semiconductor memory element such as a flash memory, a hard disk drive, a solid state drive, an optical disk, etc. The storage 129 may be a drive, etc. configured to read and write various types of information with respect to a portable storage medium such as a CD-ROM drive, a DVD drive, or a flash memory, etc.

The processing circuitry 131 includes a non-illustrated processor, and a non-illustrated memory such as a ROM or a RAM, etc. as hardware resources, to integrally control the MRI apparatus 100. The processing circuitry 131 includes the system control function 1311, the data arrangement function 1313, the image generation function 1315, a reference value setting function 1317, an error estimation function 1319, a correction function 1321, and a pulse calculation function 1323. The system control function 1311, the data arrangement function 1313, the image generation function 1315, the reference value setting function 1317, the error estimation function 1319, the correction function 1321, and the pulse calculation function 1323 are stored in the storage 129 each in a form of a computer-executable program. The processing circuitry 131 is a processor which reads a program corresponding to each function from the storage 129 and executes the program to activate the function corresponding to the program. In other words, the processing circuitry 131 that has read each program possesses the corresponding function in the processing circuitry 131 of FIG. 1.

FIG. 1 illustrates that the aforementioned functions are implemented by a single processing circuitry 131; however, the processing circuitry 131 may include a plurality of independent processors, and the functions may be implemented by the processors executing respective programs. In other words, there may be a case where each of the aforementioned functions may be configured as a program, and a single processing circuitry executes each program, or a case where each of the functions may be implemented in independent program-execution circuitry specific to respective functions.

The term "processor" used in the above description refers to, for example, a CPU (Central Processing Unit), a GPU (Graphics Processing Unit), or circuitry such as an ASIC (Application Specific Integrated Circuit), a programmable logic device (for example, an SPLD (Simple Programmable Logic Device), a CPLD (Complex Programmable Logic Device), or an FPGA (Field Programmable Gate Array)).

The processor reads and executes a program stored in the storage 129 to activate the corresponding function. A program may be directly integrated into the circuitry of the processor, instead of storing the program on the storage 129. In this case, the processor reads and executes a program integrated into the circuitry to realize the corresponding function. Similarly, the couch control circuitry 109, the transmitter 115, the receiver 119, and the sequence control circuitry 121, etc. are also configured as electronic circuitry such as the above processor, etc.

The processing circuitry 131 integrally controls the MRI apparatus 100 by the system control function 1311. Specifically, the processing circuitry 131 reads a system control program stored in the storage 129, deploys the program on a memory, and controls the respective circuitry of the MRI apparatus 100 in accordance with the deployed system control program.

Figure 2:
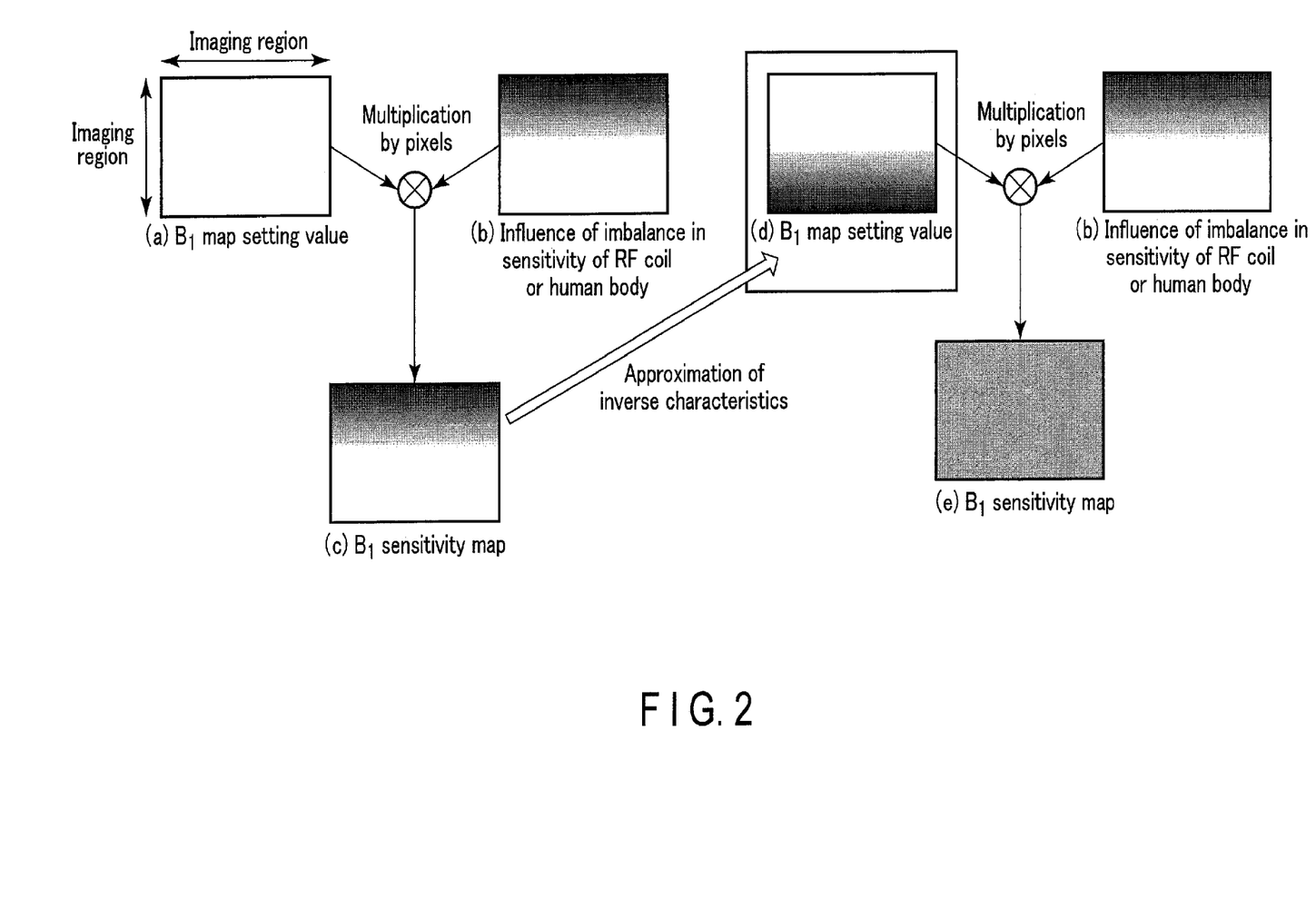
FIG. 2 is a diagram illustrating a method for mitigating inhomogeneity in the $B_1$ sensitivity map assumed in the present embodiment.

A method for mitigating the $B_1$ sensitivity map inhomogeneity assumed in the present embodiment is described with reference to the diagram of FIG. 2.

In general, when designing a $B_1$ distribution, "(a) $B_1$ map setting value" that indicates where in the real space the power is supplied with what amount in order to transmit RF pulses is designed, so that the $B_1$ distribution exhibits homogeneity in an imaging region (field of view: FOV). However, in reality, the magnetic field is affected by an imbalance in sensitivity of the RF coils or a human body, as indicated as a gradation in "(b) influence of imbalance in sensitivity of RF coil or human body". The $B_1$ sensitivity map actually acquired by the RF coils that indicates the spatial sensitivity of the receiver coils is "(c) $B_1$ sensitivity map", which exhibits sensitivity imbalance as shown in FIG. 2, in which "(b) influence of imbalance in sensitivity of RF coil or human body" is exerted on each pixel of "(a) $B_1$ map setting value".

The inhomogeneity of strength distribution of the $B_1$ distribution can be mitigated by superimposing a strength distribution that has inverse characteristics of the $B_1$ distribution onto the $B_1$ distribution. Namely, if "(d) $B_1$ map setting value", which has the inverse characteristics of "(c) $B_1$ sensitivity map" that shows inhomogeneity is generated, the influence on the magnetic field indicated in (b) can be mitigated by exerting the influence (b) on the "(d) $B_1$ map setting value". As a result, the MRI apparatus can acquire "(e) $B_1$ sensitivity map" which exhibits homogeneity.

The inverse characteristics of the "(c) $B_1$ sensitivity map" can be theoretically calculated; however, it is difficult to realize the "(d) $B_1$ map setting value" that has the inverse characteristics of the "(c) $B_1$ sensitivity map" by the RF pulses actually generated by the transmitter coils. Accordingly, in order to calculate the $B_1$ map setting value as simply as possible, a linear approximation such as the STA (Small Tip Angle) approximation is used in many cases. By using the STA approximation, when the flip angle is small, the transverse magnetization can be linearly approximated by using the magnitude $M_0$ of the magnetization vector. Via this process, the Bloch equation can be simplified, and accordingly, the k-space and the real space can be assumed as a Fourier transform pair. However, by performing the STA approximation, an error may occur between the target $B_1$ map setting value and the actual $B_1$ map setting value.

Next, an influence of an error when performing the STA approximation will be described with reference to the diagram of FIG. 3.

Figure 3:
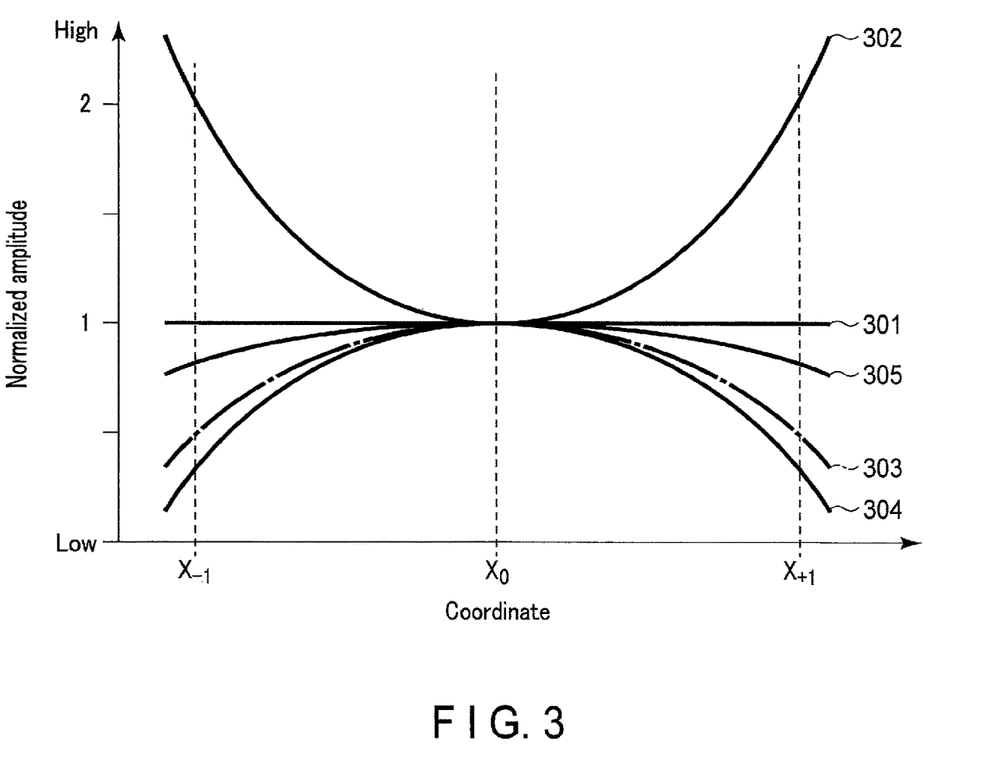
FIG. 3 is a diagram illustrating an influence of an error when performing STA approximation according to the present embodiment.

FIG. 3 illustrates the three-dimensional $B_1$ sensitivity map and $B_1$ map setting value when viewed from a one-dimensional direction. The vertical axis represents a normalized amplitude, and the horizontal axis represents coordinates in the X-axis direction.

A homogeneous $B_1$ distribution 301 that has a consistent amplitude in each X-coordinate is desirable; however, in reality, the amplitude in X-coordinates of $X_{+1}$ and $X_{-1}$ may generate an approximately twofold of the amplitude of the central coordinate of $X_0$, as shown by a $B_1$ sensitivity map 302.

If it is assumed that a target $B_1$ map setting value 303 that has the inverse characteristics of the $B_1$ sensitivity map 302 is designed, an actually-obtained $B_1$ map setting value 304 shows that a difference between the amplitude at the central coordinate $X_0$ and the amplitude at X-coordinates of $X_{+1}$ and $X_{-1}$ close to the ends of an imaging region is great due to the STA approximation. In the example shown in FIG. 3, the amplitude at X-coordinates of $X_{+1}$ and $X_{-1}$ close to the ends of the imaging region in the actual $B_1$ map setting value 304 is smaller than that of the target $B_1$ map setting value 303.

Accordingly, if RF pulses are transmitted based on the actual $B_1$ map setting value 304, the inhomogeneity in the $B_1$ sensitivity map 302 is not completely canceled. In the example of FIG. 3, the magnetic field is excessively corrected at X-coordinates of $X_{+1}$ and $X_{-1}$ close to the ends of the imaging region. As a result, instead of the ideal homogeneous $B_1$ distribution 301, an inhomogeneous $B_1$ sensitivity map 305 which has an imbalance in sensitivity is obtained.

Figure 4:
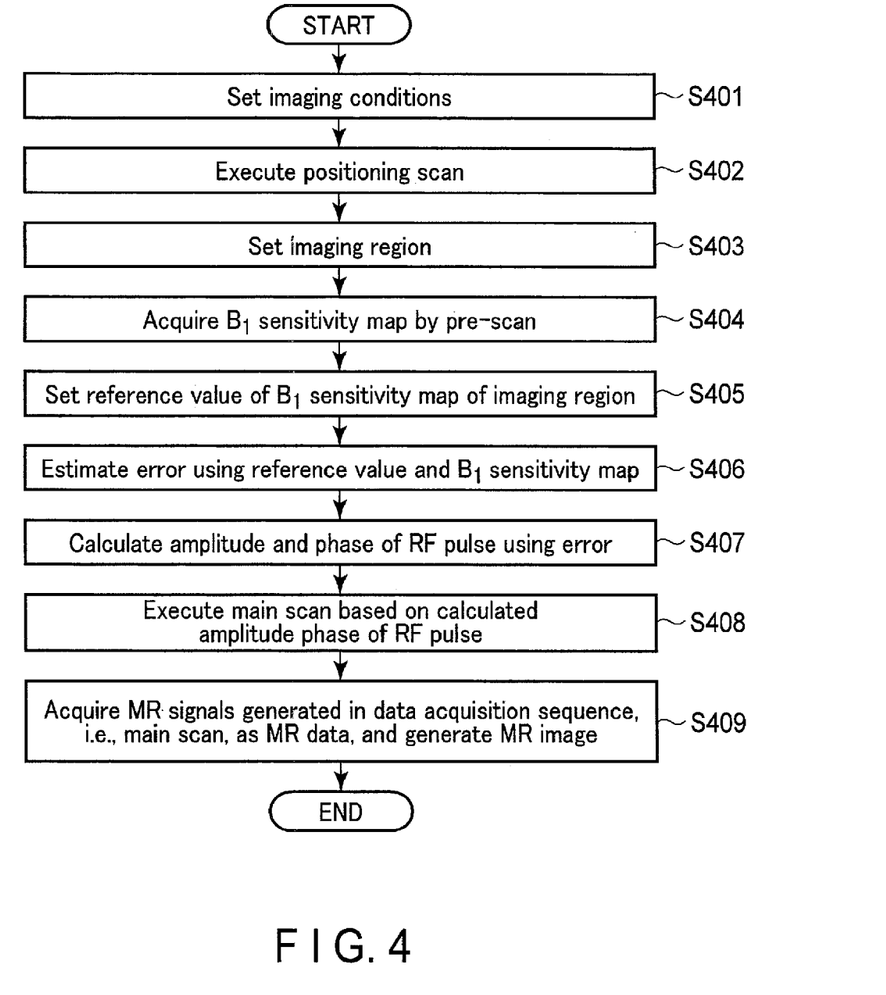
FIG. 4 is a flowchart of the imaging processing of the magnetic resonance imaging apparatus according to the present embodiment.

Next, the imaging procedure by the MRI apparatus 100 according to the present embodiment that improves inhomogeneity of the $B_1$ sensitivity map will be explained with reference to the flowchart of FIG. 4.

In step S401, imaging conditions are set. For example, the processing circuitry 131 may set the imaging conditions by reading imaging conditions stored in the storage 129, in response to an operator's instruction input through the interface 125. The imaging conditions may include, for example, an imaging target of a subject, an imaging time, and contrast, etc.

In step S402, a positioning scan is performed. The positioning scan is executed in accordance with an imaging protocol to generate a positioning image used in positioning for a main scan. Specifically, the sequence control circuitry 121 executes a positioning scan on an imaging target, in accordance with the imaging protocol for the positioning scan. Via the image generation function 1315, the processing circuitry 131 generates a positioning image based on MR data obtained by the positioning scan.

In step S403, an imaging region is set on the positioning image generated by the positioning scan. Specifically, an imaging position for the main scan is input by an operator through the interface 125, for example. The imaging region is determined by the input of the imaging position.

In step S404, a pre-scan is performed relative to the imaging region to acquire a B sensitivity map, and the $B_1$ sensitivity map is acquired. Specifically, the sequence control circuitry 121 controls the gradient field power supply 105 and each circuitry in accordance with the imaging region and the pulse sequence for the pre-scan to acquire a $B_1$ sensitivity map, and performs imaging on the subject P. The $B_1$ sensitivity map may be acquired via the publicly known method, for example, by transmitting RF pulses with two different flip angles and performing calculation by using acquired signals. The processing circuitry 131 generates, via the image generation function 1315, a $B_1$ sensitivity map in the imaging region based on the acquired MR data. The $B_1$ sensitivity map is represented as a two-dimensional coordinate space (x-y plane) in which each pixel has a pixel value.

In the case where it is assumed that a change in the $B_1$ sensitivity map is less, for example in the case where a single subject P is imaged successively, the $B_1$ sensitivity map acquired in the previous imaging is used, and step S404 may be omitted. In addition, the previously acquired $B_1$ sensitivity map may be stored, for example, in the storage 129, and the $B_1$ sensitivity map may be read from the storage 129 and used when executing the reference value setting processing by the reference value setting function 1317.

In step S405, the processing circuitry 131 sets, via the reference value setting function 1317, a reference value based on the coordinate values of the $B_1$ sensitivity map of the imaging region. The reference value may be set, for example, by the method indicated below.

Via the reference value setting function 1317, the processing circuitry 131 sets the minimum value of the $B_1$ sensitivity map within the imaging region as a reference value. Via this processing, an error in the $B_1$ sensitivity map is likely to remain, but the signal power can be maximized. Also, the processing circuitry 131 sets, via the reference value setting function 1317, the average value of the $B_1$ sensitivity map within the imaging region as a reference value. This reduces the degree of error, but the signal power is slightly lowered. Alternatively, the processing circuitry 131 sets, via the reference value setting function 1317, the maximum value of the $B_1$ sensitivity map within the imaging region as a reference value. This greatly reduces the degree of error, but the signal power is further lowered.

Via the reference value setting function 1317, the processing circuitry 131 may set a value (a first value) between the average value and the maximum value of the $B_1$ sensitivity map within the imaging region as a reference value, or set the average value of the values (the first values) between the average value and the maximum value of the $B_1$ sensitivity map within the imaging region as a reference value.

Furthermore, via the reference value setting function 1317, the processing circuitry 131 may set a value of a region of interest (ROI) within the imaging region as a reference value. This can reduce the degree of error in the ROI.

In step S406, the processing circuitry 131 estimates, via the error estimation function 1319, an error based on the reference value and the $B_1$ sensitivity map. Specifically, the processing circuitry 131 estimates, via the error estimation function 1319, an error based on an error model representing the relationship between the ratio of the $B_1$ sensitivity in relation to the reference value of the $B_1$ sensitivity map, and the reduction percentage of amplitude. The method for estimating an error will be described in detail with reference to FIG. 5.

In step S407, the processing circuitry 131 calculates, via the pulse calculation function 1323, an amplitude and a phase of an RF pulse by using the error. Specifically, the processing circuitry 131 multiplies, via the pulse calculation function 1323, the $B_1$ sensitivity map by the error, and generates a corrected $B_1$ sensitivity map. Via the pulse calculation function 1323, the processing circuitry 131 calculates reciprocals of the $B_1$ sensitivity map using the corrected $B_1$ sensitivity map to obtain the $B_1$ map setting value. The pulse calculation function 1323 calculates the amplitude and the phase of the respective RF pulses from the $B_1$ map setting value, thereby executing a scan under an optimal high frequency magnetic field distribution ($B_1$ distribution).

Via the pulse calculation function 1323, the processing circuitry 131 may correct the $B_1$ map setting value by multiplying the $B_1$ map setting value by the reciprocal of an error, instead of correcting the $B_1$ sensitivity map. Similar to the case where the amplitude and the phase of the respective RF pulses are calculated by using the corrected $B_1$ sensitivity map, the processing circuitry 131 may calculate, via the pulse calculation function 1323, the amplitude and the phase of the respective RF pulses by using the corrected $B_1$ map setting value to execute a scan under an optimal high frequency magnetic field distribution ($B_1$ distribution).

In step S408, the main scan is executed based on the calculated amplitude and phase of the respective RF pulses. For example, for data acquisition via the spoke technique, transmission pulses to be applied in the order according to the trajectory of spokes are generated, and data acquisition is executed in accordance with a data acquisition sequence, i.e., the main scan, by using the transmission pulses. Specifically, the processing circuitry 131 controls, via the system control function 1311, the sequence control circuitry 121 so that RF pulses are applied along the trajectory of spokes (described later), in accordance with the imaging region and the imaging protocol for the main scan using the spokes. The method of applying RF pulses using the spoke technique will be explained in detail with reference to FIG. 7.

For data acquisition via parallel transmission (PTx) using a plurality of transmitter coils, the amplitude and phase of a signal transmitted from each RF coil may be determined.

It is possible that data acquisition using the spoke technique is performed in the parallel transmission using a plurality of transmitter coils (referred to as "PTx Spoke"). In this case, RF pulses are emitted by each RF coil along the trajectory of spokes, and transmission pulses are generated.

The data acquisition sequence that is the main scan indicates various imaging pulse sequences used in MRI, such as the FE (Field Echo) method (or the GRE (Gradient Echo) method), the SE (Spin Echo) method, and the FSE (Fast Spin Echo) method. The transmission pulses designed by the spoke technique are used at least as part of the transmission pulses in the data acquisition sequence, and an image is generated by the acquired data based on the transmission pulses.

In step S409, MR signals generated in the data acquisition sequence that is the main scan are acquired as MR data, and an MR image is generated. Specifically, the processing circuitry 131 generates, via the image generation function 1315, an MR image based on acquired MR data. The imaging process by the MRI apparatus 100 according to the present embodiment is completed in the above processing.

An example of the method for estimating an error in step S406 will be described in detail with reference to FIG. 5.

Figure 5:
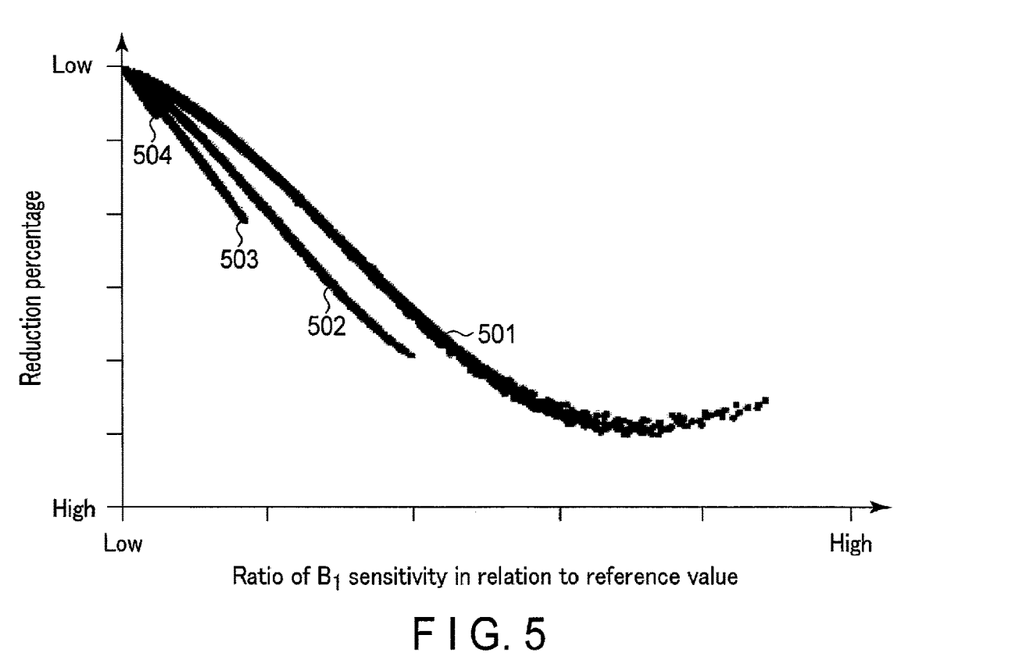
FIG. 5 illustrates an example of an error model used for error estimation according to the embodiment.

FIG. 5 illustrates an error model representing the relationship between the ratio of the $B_1$ sensitivity in relation to the reference value of the $B_1$ sensitivity map, and the reduction percentage of amplitude. In FIG. 5, it is assumed that the transmission pulses are designed via the spoke technique.

The vertical axis represents the reduction percentage indicating the reduction percentage in the signal amplitude, and the horizontal axis represents the ratio of the $B_1$ sensitivity in relation to the reference value of the $B_1$ sensitivity map.

FIG. 5 illustrates four error models predetermined for each amplitude ratio of the central spoke among the plurality of spokes. The amplitude ratio of the central spoke becomes higher in the order from an error model 501 to an error model 504. In each error model, the reduction percentage becomes higher (amplitude decreases), as the ratio of the $B_1$ sensitivity in relation to the reference value of the $B_1$ sensitivity is higher.

Via the error estimation function 1319, the processing circuitry 131 may estimate an error by fitting the ratio of the $B_1$ sensitivity in relation to the reference value of the $B_1$ sensitivity map to the determined error model. It may be determined which model among the four error models 501 to 504 is used for estimation of an error in consideration of the difference (also referred to as a "depth") between the minimum value and the maximum value of the magnetic field strength in the $B_1$ sensitivity map that is inhomogeneous in sensitivity. Since the error model 501 has a broader coverage relative to the ratio of the $B_1$ sensitivity in relation to the reference value of the $B_1$ sensitivity, the processing circuitry 131 may determine, via the error estimation function 1319, the error model 501 as an error model to be adopted. The error estimation function 1319 may calculate the average model of the four error models and estimate an error based on the average model.

Via the error estimation function 1319, the processing circuitry 131 may prepare a look up table in which the ratio of the $B_1$ sensitivity in relation to the reference value of the $B_1$ sensitivity is associated with the reduction percentage, and may estimate an error based on the look up table, instead of using the error models shown in FIG. 5. It is also possible that the error model may be a function that is obtained by fitting processing (regression analysis) using a fitting function relative to values obtained by previously performed simulations. The error may be modeled by a lower order of function such as a linear function or a quadratic function.

Next, an example of the correction processing in step S407 will be described with reference to FIG. 6.

Figure 6:
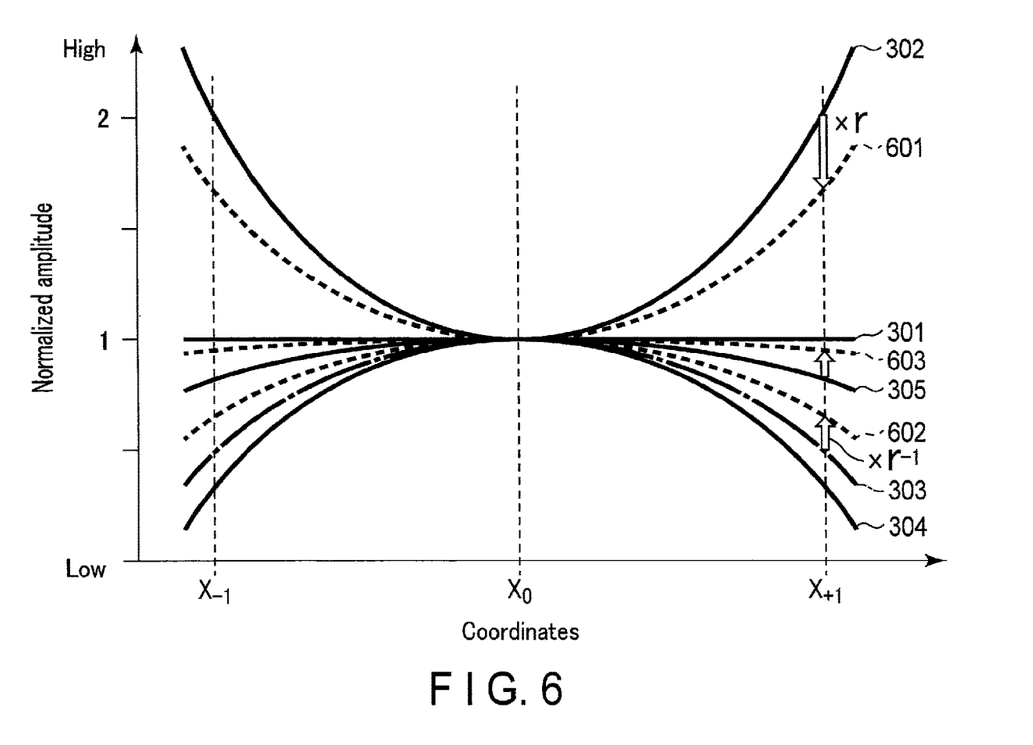
FIG. 6 is a diagram for explaining an example of correction processing according to the present embodiment.

FIG. 6 illustrates the $B_1$ sensitivity map and $B_1$ map setting values similar to those of FIG. 3.

In step S406, the error estimation function 1319 estimates an error r, and multiplies the $B_1$ sensitivity map 302 by the error r to obtain the corrected $B_1$ sensitivity map 601. The processing circuitry 131 designs, via the error estimation function 1319, a $B_1$ map setting value 602 that has inverse characteristics of the corrected $B_1$ sensitivity map 601. The processing circuitry 131 sets, via the pulse calculation function 1323, the amplitude and the phase of respective RF pulses based on the designed $B_1$ map setting value 602, and transmits RF pulses. Via this processing, a $B_1$ distribution 603 close to the desirable homogeneous $B_1$ distribution 301 can be obtained, which does not cause excessive correction.

Via the pulse calculation function 1323, the processing circuitry 131 can achieve similar advantages by calculating the target $B_1$ map setting value 303 so as to have inverse characteristics of the $B_1$ sensitivity map 302 before correction, and multiplying the target $B_1$ map setting value 303 by the reciprocal of the error r, i.e., $r^{-1}$ to calculate the $B_1$ map setting value 602.

Next, an example method of applying RF pulses using the spoke technique will be explained with reference to FIG. 7.

The spoke technique is to mitigate inhomogeneity of the $B_1$ distribution by using the $B_1$ distribution that can be generated by slice-selective pulses dispersed in k-space.

Figure 7:
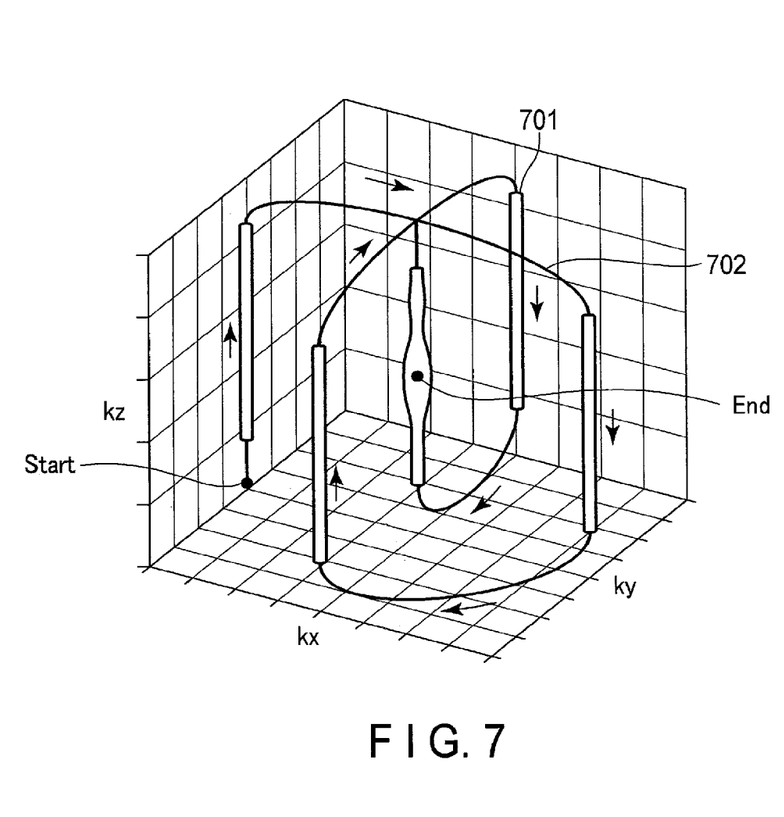
FIG. 7 illustrates a trajectory of spokes in k-space according to the present embodiment.

FIG. 7 illustrates a trajectory of spokes in k-space. In the spoke technique, lines (points in $k_x$-$k_y$ plane) of impulse (delta function) parallel to the $k_z$-axis shown in k-space are also referred to as spokes. In an example shown in FIG. 7, five spokes 701 are provided, and each spoke 701 is connected (selected) along a trajectory 702 from a "start" position to an "end" position. The trajectory 702 is a trajectory that indicates the positions of the spokes 701 in k-space expressed by $k_x$-axis, $k_y$-axis, and $k_z$-axis, and indicates an order of applying RF pulses corresponding to the spokes 701.

Each of the spokes 701 is associated with parameters (an amplitude and a phase) of an RF pulse corresponding to a position of corresponding spokes 701 in k-space. The spoke 701 at an origin that is the end position is referred to as a central spoke, the ratio of the amplitude of the central spoke in the RF pulse is utilized for determining an error model when designing transmission pulses via the spoke technique.

An RF pulse having an amplitude and a phase corresponding to each spoke 701 is applied as a sub-pulse. That is, RF pulses are designed to be an excitation pulse as an entirety of a plurality of sub-pulses. The spoke technique is also referred simply to as "spoke".

In an example shown in FIG. 7, five spokes are used. However, the number of spokes is not limited thereto, and it may be the case where three or more spokes 701, including a spoke at the k-space origin used for offset, are adopted. As the number of the spokes 701 increases, the number of sub-pulses to be applied increases, thereby increasing a time required to form an excitation pulse. Accordingly, the RF pulses may be designed to adopt an appropriate number of spokes 701 in consideration of the imaging time.

According to the aforementioned embodiment, an error is estimated based on the ratio of the $B_1$ sensitivity in relation to the reference value of the $B_1$ sensitivity, and the amplitude and the phase of respective RF pulses are determined by using the error, so that an influence of the error in the linear approximation is reduced, and the $B_1$ map setting value generated by the RF pulses can be approximate to the inverse characteristics of the $B_1$ sensitivity map with high accuracy. As a result, the $B_1$ sensitivity map inhomogeneity can be mitigated simply and with high precision.

The functions of the processing circuitry 131 explained in the embodiment can be executed based on a software program. The functions of the processing circuitry 131 are stored in a magnetic disc (flexible disc, hard disc, etc.), an optical disc (CD-ROM, CD-R, CD-RW, DVD-ROM, DVD±R, DVD±RW, etc.), a semiconductor memory, or a similar storage medium, as a program executable by a computer. As long as a storage medium is readable by a computer or a built-in system, any storage format can be adopted. In this case, the functions of the processing circuitry 131 can be realized by a computer reading the program from the storage medium and executing instructions written in the program on the CPU. In addition, the storage medium is not limited to a medium independent from a computer or a built-in system; a storage medium storing or temporarily storing a program downloaded through a local area network (LAN) or the Internet, etc. is also adoptable. Furthermore, the functions of the processing circuitry 131 may be executed not only by means of one storage medium, but also of multiple storage media. In this case, any storage format is adaptable as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising processing circuitry configured to:
   acquire a $B_1$ sensitivity map of an imaging region that includes a subject;
   set a reference value in the $B_1$ sensitivity map;
   estimate an error generated when calculating a $B_1$ map setting value based on the $B_1$ sensitivity map, by using the reference value and the $B_1$ sensitivity map, the $B_1$ map setting value being used for mitigating the $B_1$ sensitivity map inhomogeneity; and
   calculate an amplitude and a phase of an RF pulse based on the error.

2. The apparatus according to claim 1, wherein
   the processing circuitry is further configured to calculate inverse characteristics of the $B_1$ sensitivity map as the $B_1$ map setting value.

3. The apparatus according to claim 1, wherein
   the processing circuitry is further configured to correct the $B_1$ sensitivity map by using the error, and
   to calculate the amplitude and the phase of the RF pulse by using the corrected $B_1$ sensitivity map.

4. The apparatus according to claim 1, wherein
   the processing circuitry is further configured to correct the $B_1$ map setting value by using the error, and to calculate the amplitude and the phase of the RF pulse by using the corrected $B_1$ map setting value.

5. The apparatus according to claim 3, wherein the processing circuitry is further configured to perform correction by multiplying either one of the $B_1$ sensitivity map or the $B_1$ map setting value by the error.

6. The apparatus according to claim 1, wherein
   the error is an error caused by a linear approximation.

7. The apparatus according to claim 1, wherein
   the reference value is any one of a minimum value, a maximum value, an average value of the $B_1$ sensitivity map, one of first values between the average value and the maximum value, and an average value of the first values.

8. The apparatus according to claim 1, wherein
   the processing circuitry is configured to estimate a reduction percentage of a signal amplitude corresponding to a ratio of the $B_1$ sensitivity map in relation to the reference value as the error.

9. The apparatus according to claim 1, wherein
   the processing circuitry is configured to estimate the error by using an error model that is a function in relation to a reduction percentage of a signal amplitude.

10. The apparatus according to claim 9, wherein
    the error model is a fitting function that is obtained by fitting processing to values obtained by performed simulations.

11. The apparatus according to claim 1, wherein
    the $B_1$ map setting value is a value used to set the amplitude and the phase of the RF pulse so as to mitigate inhomogeneity of a magnetic field in the $B_1$ sensitivity map.

12. A pulse setting method, comprising:
    setting a reference value in a $B_1$ sensitivity map of an imaging region that includes a subject;
    estimating an error generated when calculating a $B_1$ map setting value based on the $B_1$ sensitivity map, by using the reference value and the $B_1$ sensitivity map the $B_1$ map setting value being used for mitigating the $B_1$ sensitivity map inhomogeneity; and
    calculating an amplitude and a phase of an RF pulse based on the error.

* * * * *